United States Patent
Filipp et al.

(10) Patent No.: US 10,354,198 B1
(45) Date of Patent: Jul. 16, 2019

(54) FAST QUANTUM GATES WITH FIRST-ORDER TRANSITIONS VIA FREQUENCY-MODULATED TUNABLE COUPLING ELEMENT

(71) Applicant: INTERNATIONAL BUSINESS MACHINES CORPORATION, Armonk, NY (US)

(72) Inventors: Stefan Filipp, Zurich (CH); Nikolaj Moll, Thalwil (CH); Daniel J. Egger, Thalwil (CH); Marc Ganzhorn, Muhen (CH); Andreas Fuhrer, Zurich (CH); Gian R. Von Salis, Aeugst a. A. (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/927,502

(22) Filed: Mar. 21, 2018

(51) Int. Cl.
*H03K 3/38* (2006.01)
*G06N 10/00* (2019.01)
*H01L 39/02* (2006.01)
*H01L 39/22* (2006.01)

(52) U.S. Cl.
CPC ............ *G06N 10/00* (2019.01); *H01L 39/025* (2013.01); *H01L 39/223* (2013.01); *H03K 3/38* (2013.01)

(58) Field of Classification Search
CPC ........ G06N 10/00; H03K 3/38; H01L 39/223; H01L 39/025
See application file for complete search history.

(56) References Cited

U.S. PATENT DOCUMENTS

| | | | |
|---|---|---|---|
| 2015/0186791 A1 | 7/2015 | Pesetski et al. | |
| 2017/0116542 A1 | 4/2017 | Shim et al. | |
| 2017/0193388 A1 | 7/2017 | Filipp et al. | |
| 2017/0212860 A1* | 7/2017 | Naaman | G06F 13/4027 |

OTHER PUBLICATIONS

Abdumalikov et al., "Experimental Realization of Non-Abelian Geometric Gates," arXiv preprint arXiv:1304.5186, 2013, 4 pages.
Barends et al., "Digitized adiabatic quantum computing with a superconducting circuit," Nature 534.7606, 2016, pp. 222-226.
Chen et al., "Qubit Architecture with High Coherence and Fast Tunable Coupling." Physical Review Letters 113.22, 2014, 5 pages.
Cirac et al., "Quantum Computations with Cold Trapped Ions," Physical Review Letters 74.20, 1995, pp. 4091-4094.

(Continued)

*Primary Examiner* — John W Poos
(74) *Attorney, Agent, or Firm* — Cantor Colburn LLP; Daniel Morris (57) ABSTRACT

Techniques relate to operating a quantum processing device is provided. The device includes at least two fixed-frequency quantum circuits coupled to a frequency-tunable coupler. The frequency of the coupler can be modulated so as to drive at least two selectively addressable energy transitions in the quantum processing device. The method includes modulating the frequency of the coupler so as to drive two first-order energy transitions. This is done so as to transfer (at least partly) an excitation of one of the quantum circuits to at least another one of the quantum circuits, via the tunable coupler. Related quantum processing devices are also provided.

20 Claims, 9 Drawing Sheets

(56) References Cited

OTHER PUBLICATIONS

Córcoles et al., "Demonstration of a quantum error detection code using a square lattice of four superconducting qubits," Nature communications 6:6979, 2015, 10 pages.
Dewes, "Demonstrating Quantum Speed-Up with a Two-Transmon Quantum Processor," Université Pierre et Marie Curie-Paris VI, PhD Thesis, 2012, 205 pages.
E.Lucero et al., "High-Fidelity Gates in a Single Josephson Qubit," Physical Review Letters, 100, 247001, Jun. 16, 2008, 5 pages, https://journals.aps.org/prl/abstract/10.1103/PhysRevLett.100.247001Accessed on Mar. 21, 2018.
Egger et al., "Adaptive hybrid optimal quantum control for imprecisely characterized systems," arXiv preprint arXiv:1402.7193, 2014, 11 pages.
Featonby et al., "Adiabatic transfer for atomic interferometry," Physical Review A 53.1, 1996, pp. 373-380.
Gambetta et al., "Superconducting Qubit with Purcell Protection and Tunable Coupling," Physical Review Letters 106.3, 2011, 4 pages.
Gordon et al., "Universal Dephasing Control During Quantum Computation," Department of Chemical Physics, Weizmann Institute of Science, arXiv preprint arXiv:0708.1308, 2007, 4 pages.
Kelly et al., "Optimal Quantum Control Using Randomized Benchmarking," Physical Review Letters 112.24, 2014, 5 pages.
Kyoseva et al., "Coherent pulsed excitation of degenerate multistate systems: Exact analytic solutions," Department of Physics, Sofia University, arXiv preprint arXiv:0802.4254, 2008, 11 pages.
M. Amniat-Talab et al., "Superposition of states by adiabatic passage in N-pod systems," Physical Review A, Jan. 21, 2011, https://journals.aps.org/pra/abstract/10.1103/PhysRevA.83.013817;Accessed on Mar. 21, 2018.
McKay et al., "A universal gate for fixed-frequency qubits via a tunable bus," arXiv preprint arXiv:1604.03076, 2016, 10 pages.
Mlynek et al., "Demonstrating W-type Entanglement of Dicke-States in Resonant Cavity Quantum Electrodynamics," arXiv preprint arXiv:1202.5191, 2012, 5 pages.
Mølmer et al., "Multiparticle Entanglement of Hot Trapped Ions," Physical Review Letters 82.9, 1999, pp. 1835-1838.
Noguchi et al., "Generation of Dicke States with Phonon-Mediated Multi-level Stimulated Raman Adiabatic Passage," arXiv preprint arXiv:1209.0923, 2012, 5 pages.
Paik et al., "Observation of High Coherence in Josephson Junction Qubits Measured in a Three-Dimensional Circuit QED Architecture," Physical Review Letters 107.24,240501, 2011, 5 pages.
R.Unanyana et al., "Robust creation and phase-sensitive probing of superposition states via stimulated Raman adiabatic passage (STIRAP) with degenerate dark states," Optics Communications, vol. 155, Issues 1-3, Oct. 1998, pp. 144-154, https://www.sciencedirect.com/science/article/abs/pii/S0030401898003587; Accessed on Mar. 21, 2018.
Sjöqvist et al., "Non-adiabatic holonomic quantum computation," New Journal of Physics 14.10, 2012, 11 pages.
Strand et al., "First-order sideband transitions with flux-driven asymmetric transmon qubits," Physical Review B 87.22, 2013, 5 pages.
Zanardi et al., "Holonomic quantum computation," Physics Letters A, 264, 1999, pp. 94-99.

* cited by examiner

FAST QUANTUM GATES WITH FIRST-ORDER TRANSITIONS VIA FREQUENCY-MODULATED TUNABLE COUPLING ELEMENT

BACKGROUND

The present invention generally relates to the field of quantum processing devices and operations thereof, and more specifically, to operating quantum processing devices with fixed frequency quantum circuits (e.g., superconducting qubits), coupled to a frequency-tunable coupler, as well as related devices.

Recent advances in quantum enhanced sensing and quantum computing are making these technologies ever more relevant to industrial applications. Both quantum sensing and quantum computing make direct use of quantum-mechanical phenomena, such as superposition and entanglement. Quantum sensing aims at enhancing the precision of a measurement apparatus, whereas quantum computers perform operations on data entanglement. Superconducting circuits are relatively easy to manufacture with current technologies and are thus promising candidates to further scale quantum information technologies. Today, it can be envisioned that in the near term a small quantum computer, based on a couple of hundreds of superconducting qubits with limited to no error correction, will be able to simulate quantum systems intractable to conventional computers.

Despite improvements in engineering quantum systems, superconducting qubits can only store quantum information for a finite lifetime, which is known as the coherence time. Both quantum sensing and quantum computing ideally need a rapid and high-fidelity generation of highly entangled multi-qubit states. Currently, such states can only be prepared by sequentially carrying out many two-qubit gate operations, which preparation consumes a substantial amount of the coherence time of the qubits. Furthermore, this preparation limits the number of qubits that can be used, in practice, because the duration of the state preparation increases with the number of qubits. The duration of the state preparation must, however, be much shorter than the coherence time. When the duration of the state preparation is comparable to the coherence time, the system can no longer be operated. Shorter state preparation (as, for example, obtained using gates that act on and entangle multiple qubits at once) would allow a quantum computer or a quantum sensor to perform with less error and be scaled to a larger number of qubits.

In the field of superconducting qubits, the multi-qubit, single-step state preparation problem was so far not an issue. Indeed, the size of the studied systems is currently limited to a few qubits and reliable two-qubit entangling gates are short compared to the qubit's coherence time. There are known two-qubit gates, among various other possible existing realizations, which are implemented with transmon qubits, where qubits are coupled via a frequency tunable coupler element. In contrast to other approaches, this implementation takes advantage of the high coherence of fixed frequency qubits to generate entangled two qubit states with fidelities of more than 97%. However, gate rates are still relatively slow (hundreds of nanoseconds).

SUMMARY

According to a first aspect, embodiments of the present invention provide a method of operating a quantum processing device. The device comprises at least two fixed frequency quantum circuits coupled to a frequency-tunable coupler. The frequency of the coupler can be modulated so as to drive at least two selectively addressable energy transitions in the quantum processing device. The method accordingly comprises modulating the frequency of the coupler so as to drive two first-order energy transitions. This is done so as to transfer, at least partly, an excitation of one of the quantum circuits to at least another one of the quantum circuits, via the tunable coupler.

The present approach leverages the high-coherence of the fixed frequency circuits and short operation times allowed by the first-order transitions, e.g., to achieve high gate rates. This approach may notably be used to allow a number of fixed frequency qubits to be entangled within a single, short operation. Accordingly, the above method can be exploited to obtain shorter state preparation. This, in turn, makes it possible for a quantum computer or a quantum sensor to perform with less error and to be scaled to a larger number of qubits.

In embodiments of the invention, the frequency of the tunable coupler is modulated at two frequencies. That is, the coupler is, on the one hand, modulated at a first frequency, so as to drive a first transition and thereby transfer (at least partly) an excitation of said one of the quantum circuits to the tunable coupler. On the other hand, the coupler is modulated at one or more second frequencies (each distinct from the first frequency), so as to drive one or more second transitions, respectively, and thereby further transfer (at least partly) this excitation from the tunable coupler to another one of the quantum circuits. Each of the first and second transition(s) is a first-order energy transition.

The frequency of the tunable coupler may be first modulated at said first frequency to drive the first transition and subsequently modulated at said at least one second frequency to drive the at least one second transition after the first transition. Preferably (but not a necessity) though, the frequency of the tunable coupler is concomitantly modulated at said first frequency and said at least one second frequency, so as to concomitantly drive the first transition and the at least one second transition. That is, the time period during which the tunable coupler is modulated with the second frequency(ies) at least partly overlaps with the time period during which the tunable coupler is modulated at the first frequency, so as to increase the operation speed. Using concomitant drives makes it possible to achieve high gate rates (e.g., in the 10-100 megahertz (MHz) range), with corresponding gate times in the 100 nanoseconds (ns)-10 ns range, that is, as fast as single qubit gates. As a result, single entangling operations can be achieved within times that can be as short as 10 ns.

When modulating the frequency of the tunable coupler, the drives at said first and second frequencies may be switched on at paces chosen so as to generate an adiabatic holonomic gate transformation.

Embodiments of the invention rely on so-called "red sideband transitions", which can easily be driven, e.g., by way of harmonic microwave signals applied to the tunable coupler. Of particular interest is to exploit a particular excited state $|gg \ldots, 1\rangle$. That is, each of the first frequency and the second frequency(ies) may correspond to a difference of energy between a pair of excited states of the quantum processing device, wherein each pair of excited states involves this excited state $|gg \ldots, 1\rangle$, which is representable as a tensor product involving an excited state $|1\rangle$ of the tunable coupler and a ground state $|g\rangle$ of each of the quantum circuits. Because the same excited state $|gg \ldots, 1\rangle$ is involved in each of the differences of energy corresponding to the first and second frequency(ies), this state is later referred to as a "reference" excited state |gg . . . , 1>.

For instance, each of the first frequency and the at least one second frequency may correspond to a difference of energy between said reference excited state |gg . . . , 1> and an excited state |ab . . . , 0>. The excited state |ab . . . , 0> is representable as a tensor product involving a ground state |0> of the tunable coupler and a state |ab . . . > of the quantum circuits. The state |ab . . . > is itself representable as a tensor product involving the excited state |e> of one, only, of the quantum circuits and a ground state |g> of each of the remaining quantum circuits.

That the first and second frequencies "correspond", each, to a difference of energy as defined above, means that such frequencies can be equal to such energy differences or, in variants, close to such differences of energy.

As evoked above, the first-order energy transitions can be driven by applying harmonic microwave signals to the tunable coupler. The signals applied are modulated so as to modulate the frequency of the tunable coupler, in order to drive said first transition and said at least one second transition.

Remarkably, the present methods can be implemented so as to operate a quantum processing device with more than two fixed frequency quantum circuits. This way, one may transfer an initial excitation to a plurality of quantum circuits. Namely, the quantum processing device may comprise at least three fixed frequency quantum circuits. Again, each quantum circuit is coupled to a tunable coupler. The frequency of the tunable coupler is concomitantly modulated, on the one hand, at a first frequency, so as to drive a first transition, and, on the other hand, at two or more second frequencies, so as to concomitantly drive two or more second transitions, respectively. This way, excitations can be transferred (again, at least partly) from the tunable coupler to two or more other ones of the quantum circuits. Each of said transitions is a first-order energy transition, so as to ensure a fast operation.

Operations as described herein may further require suitably setting amplitudes and phases of signals applied to the tunable coupler, e.g., so as to achieve a multipartite entangled state of the quantum circuits. The present methods, as well as quantum processing devices as described herein, can notably be operated so as to implement one or more quantum gates. In turn, each gate may operate on one or more of the quantum circuits. However, since the tunable coupler is not meant to be used as a computational qubit, such a quantum gate will not operate (at least not in effect), on states of the tunable coupler.

Embodiments of the invention implement a universal set of gates, based on states of the at least two quantum circuits. However, such gates are not based on states of the tunable coupler, for the same reasons as mentioned above.

For example, amplitudes and phases of signals applied to the tunable coupler may be set, prior to, or while modulating the frequency of such signals, so as to achieve an iSWAP gate, a c-Phase gate, a Fredkin gate (also known as also CSWAP gate) or a square root of a SWAP gate (commonly denoted by $\sqrt{SWAP}$), or any combination of such gates.

According to another aspect, embodiments of the invention provide a quantum processing device. The quantum processing device comprises at least two fixed frequency quantum circuits, a tunable coupler, to which the at least two quantum circuits are coupled, and a controller. The controller is configured, in the quantum processing device, to modulate a frequency of signals applied to the tunable coupler, so as to drive at least two first-order energy transitions in the quantum processing device, whereby an excitation of one of the quantum circuits can be transferred (at least partly) to at least another one of the quantum circuits, via the tunable coupler, in operation.

Consistently with present methods, the controller is preferably (but not a necessity) configured to modulate the frequency of the coupler at on the one hand, a first frequency, so as to drive a first transition and thereby transfer (at least partly) an excitation of said one of the quantum circuits to the coupler, and, on the other hand, at least one second frequency (distinct from the first frequency), so as to drive at least one second transition, respectively, and thereby further transfer (at least partly) this excitation from the coupler to said at least another one of the quantum circuits, in operation. Again, each of the first transition and the at least one second transition is a first-order energy transition.

In embodiments of the invention, the controller is further configured to first modulate the frequency of signals applied to the tunable coupler at said first frequency, so as to drive the first transition, and to subsequently modulate this frequency at said at least one second frequency, to drive the at least one second transition after the first transition, in operation. Preferably (but not a necessity), the controller is configured to concomitantly modulate signals applied to the tunable coupler at said first frequency and said at least one second frequency, so as to concomitantly drive the first transition and the at least one second transition, in operation.

For example, the quantum processing device may comprise at least three fixed frequency quantum circuits, each coupled to the tunable coupler. The controller may, in that case, be configured to concomitantly modulate the frequency of the tunable coupler, on the one hand, at said first frequency, so as to drive said first transition, and, on the other hand, at two or more second frequencies, so as to concomitantly drive two or more second transitions, whereby excitations can be transferred (at least partly) from the tunable coupler to at least two other ones of the quantum circuits, in operation. Again, each of said second transitions is a first-order energy transition.

Particularly, each of said quantum circuits is a superconducting quantum circuit. In particular, each of the quantum circuits may be a fixed frequency, transmon-type quantum circuit. The tunable coupler may for instance be capacitively coupled to each of the at least two quantum circuits.

In embodiments of the invention, the tunable coupler comprises two electrodes separated by a superconducting quantum interference device loop having two Josephson junctions, so as to couple to the at least two quantum circuits.

In variants, the tunable coupler comprises a single electrode with a superconducting quantum interference device loop coupled to a ground, so as to couple to the at least two quantum circuits.

According to another aspect, embodiments of the invention provide a quantum processing chip. The quantum processing chip comprises a plurality of cells. Each of the cells involves at least two fixed frequency quantum circuits and a tunable coupler, to which the at least two quantum circuits are coupled. In addition, a controller system is configured in the quantum processing chip to modulate a frequency of signals applied to each tunable coupler of each of the cells, so as to drive at least two first-order energy transitions in selected ones of the cells. This way, and for each of said selected ones of the cells, an excitation of one of the quantum circuits can be transferred, at least partly, to at least another one of the quantum circuits, via a respective tunable coupler, in operation.

Quantum processing devices, chips, and methods according to embodiments of the present invention will now be further described, by way of non-limiting examples, and in reference to the accompanying drawings.

BRIEF DESCRIPTION OF THE DRAWINGS

The accompanying drawings show simplified representations of devices or parts thereof, as involved in embodiments of the present invention. Similar or functionally similar elements in the figures have been allocated the same numeral references, unless otherwise indicated.

DETAILED DESCRIPTION

Figure 1:
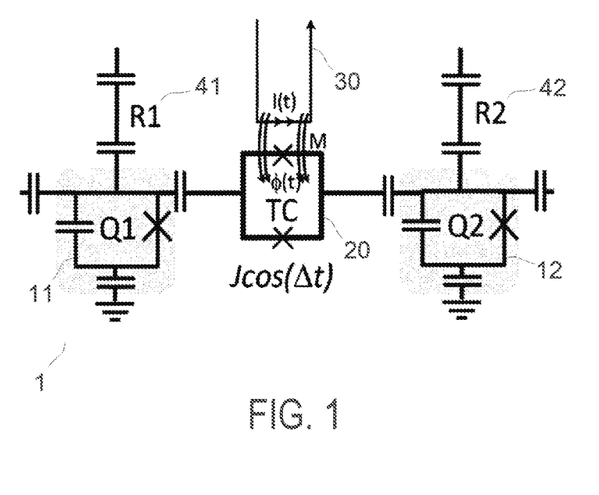
FIG. 1 shows a circuit diagram of an example of a multi-qubit coupling architecture, involving one or more frequency-tunable couplers, according to embodiments of the present invention.
Figure 2:
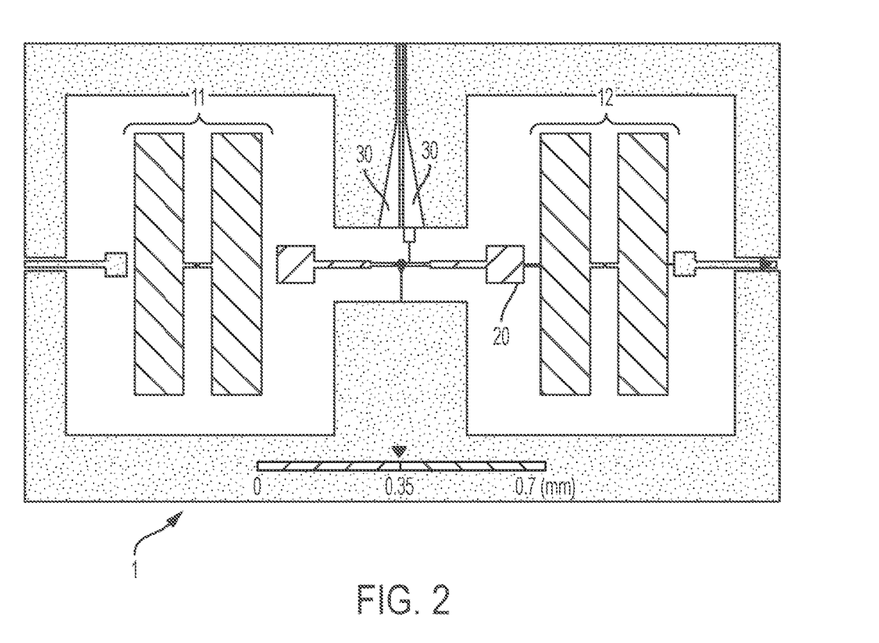
FIG. 2 shows an example geometry for a multi-qubit coupling architecture as in FIG. 1, using two transmon-type qubits coupled via a third transmon qubit that is configured as a frequency-tunable coupling element, according to embodiments of the present invention.
Figure 3:
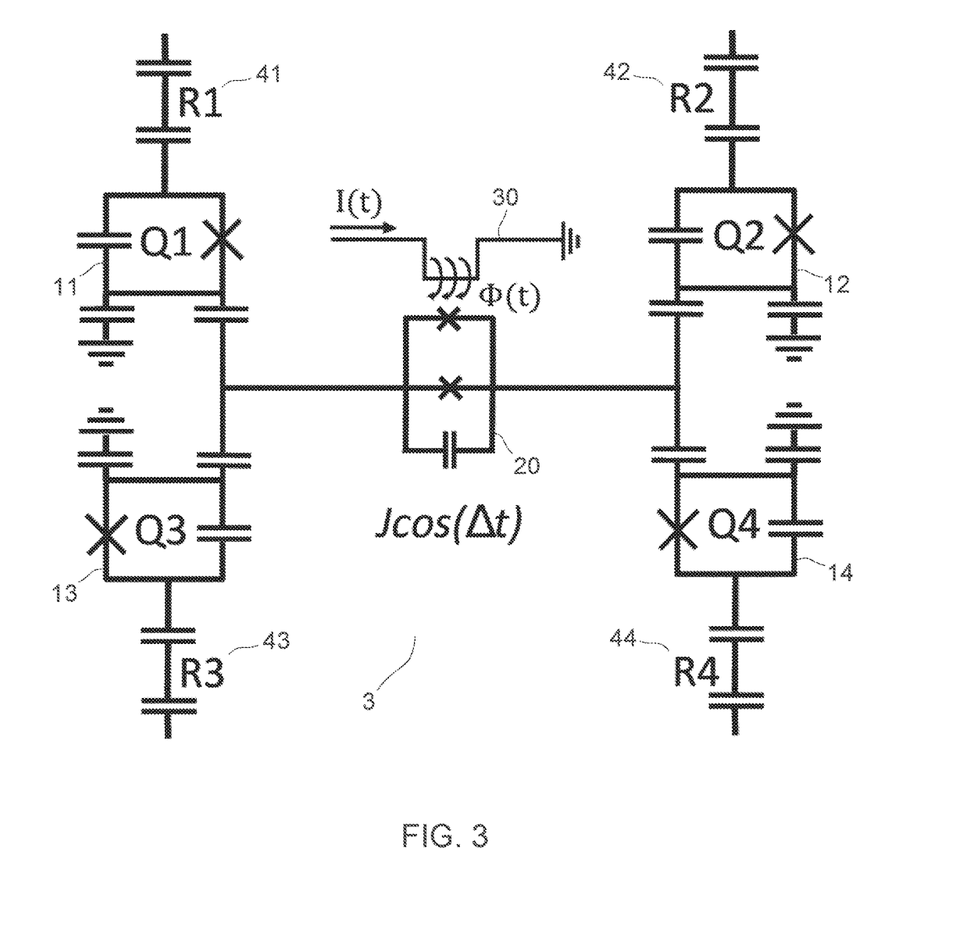
FIG. 3 shows a circuit diagram of an example of a multi-qubit coupling architecture, involving one or more frequency-tunable couplers, according to embodiments of the present invention.
Figure 4:
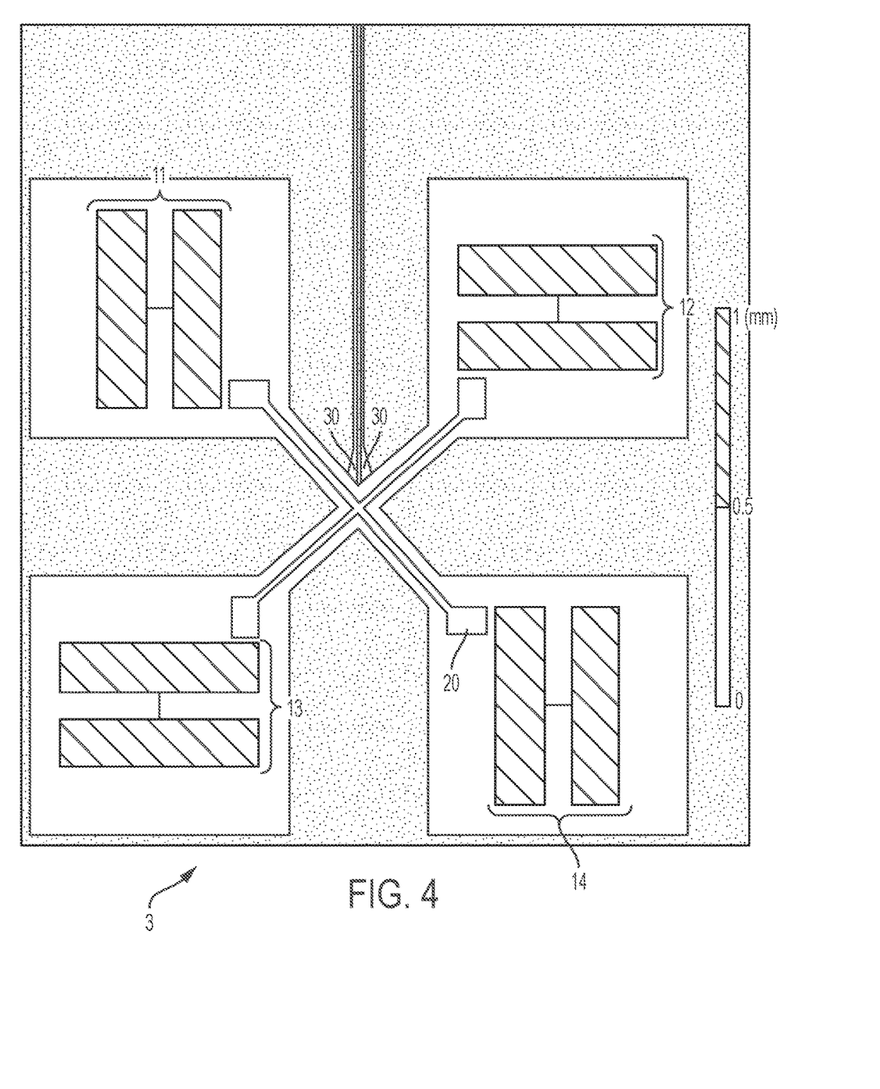
FIG. 4 shows an example geometry for a multi-qubit coupling architecture as in FIG. 3, using four transmon-type qubits coupled via a qubit configured as a frequency-tunable coupling element, according to embodiments of the invention.

In reference to FIGS. 1-10, an aspect of embodiments of the invention is first described, which relates to a method of operating a quantum processing device 1, 3, 4. Technical features depicted in FIGS. 2 and 4 are not necessarily to scale. This quantum processing device 1, 3, 4 is in all cases assumed to comprise at least two fixed frequency quantum circuits 11-14, 1n and a tunable coupler 20. The tunable coupler 20 acts as a frequency-tunable coupling element. The quantum circuits are, each, coupled to the tunable coupler 20. It is further assumed that the frequency of the tunable coupler 20 can be modulated, in order to drive selectively addressable energy transitions in the device 1, 3, 4, for the purpose of implementing the present methods, according to embodiments of the invention.

Consistently, such methods generally revolve around modulating the frequency of the tunable coupler 20 (see steps S20, S20a, S20b in the flowchart of FIGS. 9, 10), in order to drive (S30, S30a, S30b) two first-order energy transitions. This is further carried out so that an excitation of one of the quantum circuits 11-14, 1n is at least partly transferred (S40, S40a, S40b) to at least another one of the quantum circuits 11-14, 1n, via the tunable coupler 20.

To that aim, one may rely on a controller 32 (e.g., which can be realized as and/or include one or more control lines 30), to apply harmonic microwave signals (i.e., coherent microwave tones) to components of the system and trigger the desired transitions. This may notably require to adjust amplitudes and phases of the signals applied, in addition to modulating their frequency.

Each of the quantum circuits 11-14, 1n is typically a non-linear quantum circuit, which can be used as a qubit 11-14, 1n. By "non-linear", it is meant that at least two distinct energy levels (i.e., of different energies) of the quantum circuits can be addressed. However, the fixed frequency quantum circuits can also be harmonic oscillators, for instance.

According to the present approach, the excitation of one of the quantum circuits 11-14, 1n is at least partly transferred to another quantum circuit, via the tunable coupler 20. The terminologies "at least partly transferred" and the like, as used herein, mean that the excitation may, in embodiments of the invention, possibly be fully transferred, in which cases the excitation is fully swapped from one quantum circuit to the other. However, in other embodiments of the invention, this excitation may also be transferred with a well-defined, predetermined probability, which is less than 1 (and yet greater than 0). Partial transfer of this excitation allows entangled states to be created, with excitations shared among the quantum circuits 11-14, 1n. In contrast, a full transfer allows an excitation to be swapped. Unless otherwise stated, excitation transfers evoked in the present description may correspond to partial or full transfers.

The present methods all rely on first-order transitions, to enable a more efficient process. For instance, so-called red sideband energy transitions can be contemplated, as later described in detail.

Such transitions may involve excited states of the quantum circuits that differ from each other, in energy, so as to make them more easily addressable. For example, in that case, the frequency of the tunable coupler 20 needs to be modulated at corresponding frequencies, so as to drive the desired transitions in the quantum processing device 1, 3, 4. To that aim, suitable frequencies need to be identified and applied, e.g., through a control line 30.

In varied implementations, the excited states of the quantum circuits involved may have close or, even, identical energies. For example, distinct circuits may have excited states of close or identical energies. In that case, the energy transitions signals need to be selectively targeted using some other means. It may for instance be possible to have identical energies and drive all transitions at once. Typically, what happens in such a case is that the final state will oscillate between the initial state and the all-quantum-circuit superposition state, with weights given by the couplings of the individual circuits. To achieve a certain gate, for example, the couplings have to be either set in design or made tunable. In the present case, the amplitudes and/or phases of the applied signal can be chosen, so as to drive the desired first-order, energy transitions, as if distinct frequencies were used (although cross-talk issues might slightly impair the process in that case, it is not a problem).

At least one tunable coupler 20 is involved. Still, two or more tunable couplers may possibly be needed, e.g., in an array of cells, where each cell contains one coupler and two or more quantum circuits, as in embodiments of the invention described later in reference to FIG. 5. In general, the present processing devices 1, 3, 4 may comprise a large array of quantum circuits and couplers. Such devices may, in general, be embodied as quantum enhanced sensing devices or quantum computing devices.

The present "quantum circuits" 11-14, 1n are meant to be used as computational qubits (they are accordingly often referred to as "qubit" in the following). On the contrary, the tunable coupler 20 is not meant to be used as a computational qubit, even if the coupler 20 can be embodied as a qubit, as exemplified latter. Rather, the role of the coupler 20 is merely to couple the quantum circuits, to achieve the desired transitions.

State-of-the-art methods are known, which rely on interactions between two qubits, or between one qubit and a resonator. However, the present architecture involves at least two qubits coupled to a tunable coupler according to embodiments of the invention. Yet, the present coupler 20 has a tunable frequency and is not meant to be used as a computational qubit by the quantum processing device 1, 3, 4. On the contrary, each of the computational quantum circuits (e.g., qubits) 11-14, 1n has a fixed frequency (hence not tunable). This, as one may realize, allows the device 1, 3, 4 to be substantially less sensitive to flux-noise. As such, longer coherence time of the fixed frequency devices can advantageously be exploited, e.g., to implement longer and/or more complex algorithms.

The present approach allows excitations to be swapped between two or more coupled qubits or partly transferred from one of the coupled qubits to the others, by suitably modulating the frequency of the tunable coupler. As first-order energy transition are involved, the present approach notably allows a number of fixed frequency qubits to be entangled with a single, short operation. This approach can notably be used to concomitantly transfer excitations (i) from one quantum circuit to the coupler and (ii) from the coupler to other quantum circuits, which has tremendous advantages in terms of operation speed. Doing this with suitable pulse shapes (e.g., having same amplitudes) results in transferring excitations from one qubit to the others, leaving the tunable coupler 20 unpopulated. Even more so, by simultaneously driving the desired transitions to other qubits, the two-step operation can be completed as fast as a single qubit-to-coupler transfer.

By choosing appropriate frequencies, amplitudes, phases pulses of the drives, excitations of different multi-qubit states can be created. Not only is the high-coherence of fixed frequency qubits exploited, but, in addition, concomitant drives makes it possible to achieve high gate rates (e.g., in the 10-100 MHz range), with corresponding gate times in the 10 ns-100 ns range, i.e., as fast as single qubit gates. In other words, single entangling operations can possibly be achieved within 10 ns.

Thus, the present approach can notably be used to enable shorter state preparation times. This, in turn, makes it possible for a quantum computer or a quantum sensor to perform with less error and to be scaled to a larger number of qubits.

All these aspects and related advantages are discussed in detail in the following, in reference to particular embodiments of the invention.

Figure 9:
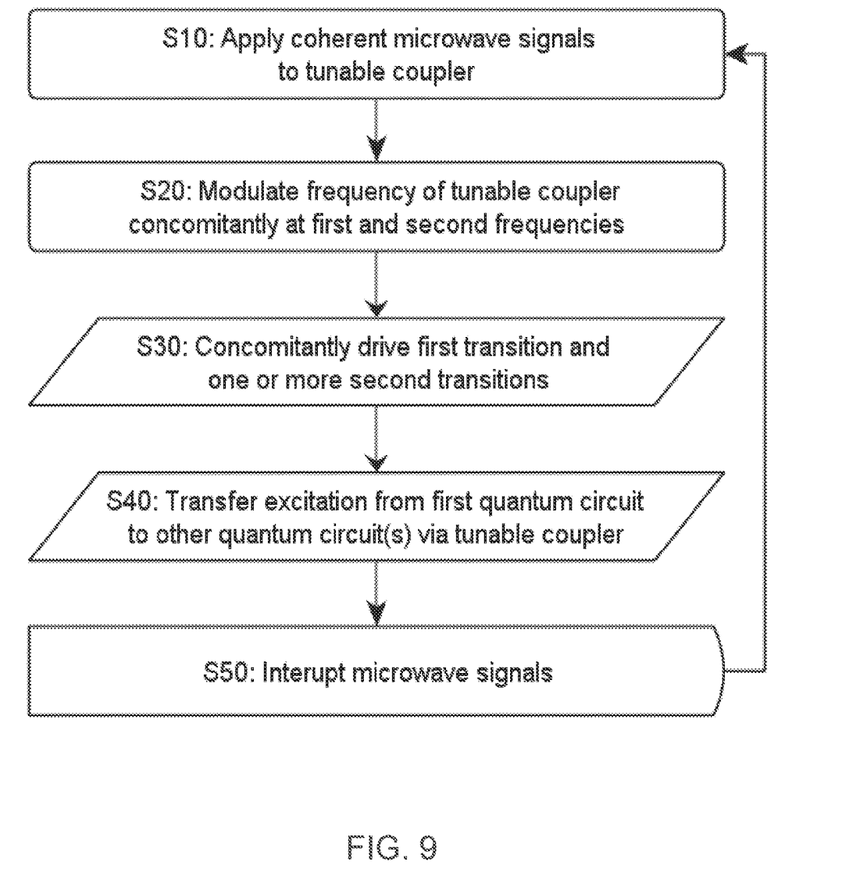
FIG. 9 is a flowchart illustrating high-level steps of a method of operating a quantum processing device, where first-order energy transitions are concomitantly driven, according to embodiments of the present invention.
Figure 10:
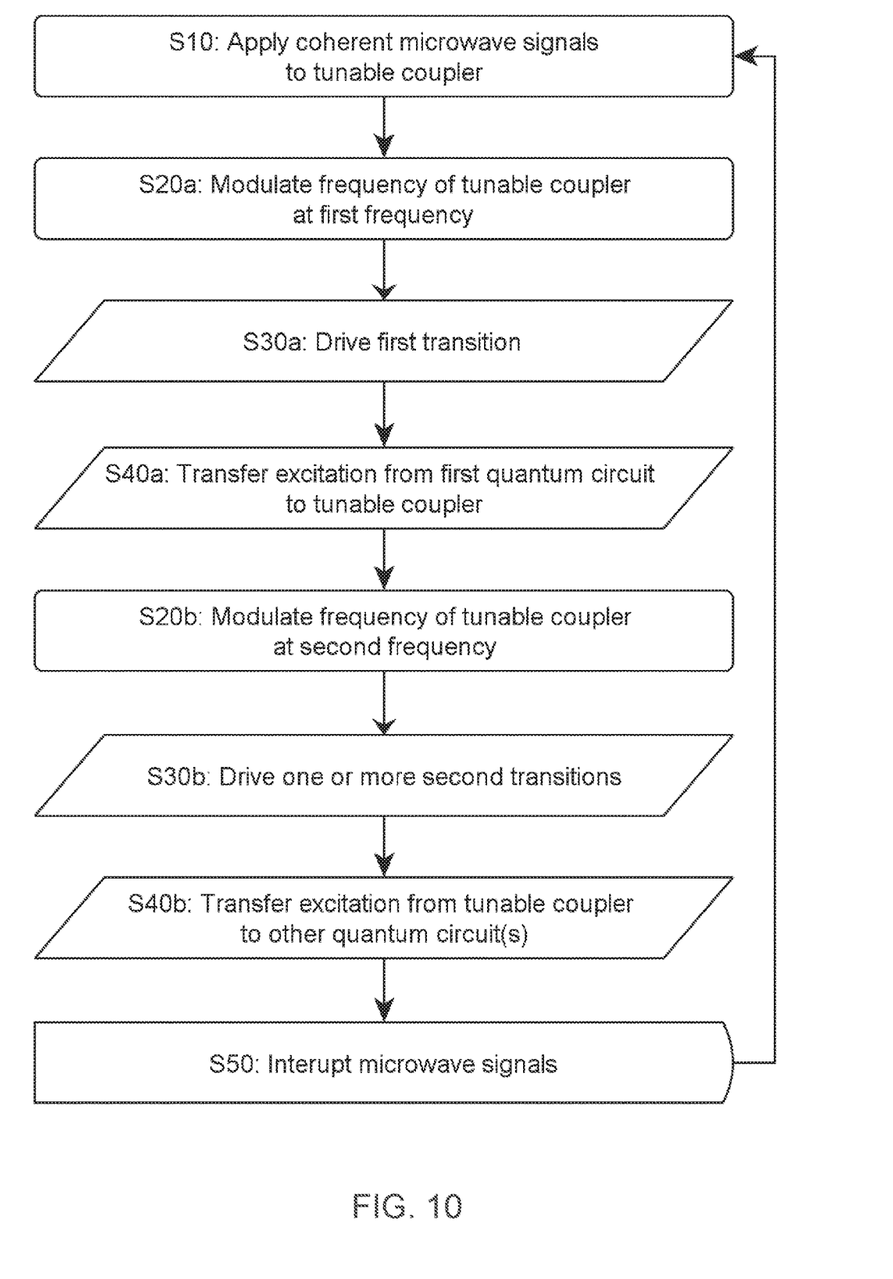
FIG. 10 is another flowchart, illustrating steps of a method similar to that of FIG. 9, except that the first-order energy transitions are sequentially driven, according to embodiments of the present invention.

Referring more particularly to the flowcharts of FIGS. 9, 10, the frequency of the tunable coupler 20 is, in embodiments of the invention, modulated (S20, S20a, S20b) at two frequencies. That is, the coupler is, on the one hand, modulated at a first frequency, so as to drive (S30, S30a) a first transition. This results in transferring an excitation of one of the quantum circuits 11-14, 1n to the tunable coupler 20. On the other hand, the coupler 20 is modulated at one or more second frequencies (distinct from the first frequency), so as to drive (S30, S30b) one or more second transitions, respectively. The modulation frequencies should be at, or close to, the transition frequencies in practice. This way, the excitation transferred to the tunable coupler can be further transferred from the tunable coupler 20 to one or more of the remaining quantum circuits 11-14, 1n.

Still, each of the first and the one or more second transitions relied on is a first-order energy transition, so as to ensure speed of operation. In contrast, higher-order energy transitions require longer times to complete and, this, with lower probabilities.

As illustrated in FIG. 10, the process may involve two successive transitions. That is, the frequency of the tunable coupler 20 may first be modulated (S20a) at a first frequency (to drive (S30a) the first transition). Then, the coupler 20 is subsequently modulated (S20b) at one or more second frequencies, so as to drive (S30b) respective, second transitions after the first transition. Here, the two successive transitions involve a certain time gap in between. Such an approach makes it possible to easily control the applied signals, but it impacts the corresponding gate times.

Now, surprisingly enough, using concomitant drives allows similar effects to be achieved, as present inventors have realized. Thus, in particular implementations (which may be preferred but are not a necessity) such as illustrated in FIG. 9, the two drives overlap, timewise. In other words, the modulations used to drive the two transitions are concomitantly applied, so as to reduce the operation time. Here, "concomitant" means that the time period during which the tunable coupler is modulated at the second frequencies at least partly overlaps with the time period during which tunable coupler is modulated at the first frequency. The modulations may even be simultaneously applied, in order to accelerate the transfers.

Namely, the frequency of the tunable coupler 20 can be concomitantly (or, even, simultaneously) modulated (S20) at a first frequency and at one or more second frequencies, so as to concomitantly (or simultaneously) drive (S30) the first transition and the one or more second transitions. Such a mode of operation is particularly advantageous for creating fast multipartite entanglement of several quantum circuits 11-14, 1n. The concomitant (e.g., simultaneous) modulation at two or more frequencies may give rise to a collective, resonant interaction between the qubits and the tunable coupler 20.

In practice, the operations (S20-S40 (or S20a-S40a)) depicted in FIGS. 9 and 10 are repeatedly performed (S50-

S10), each cycle aiming at modifying a state of the quantum processing system. This is typically achieved by applying (S10) harmonic microwave signals (i.e., coherent tones) to the tunable coupler 20, e.g., via a controller 32 and a control line 30. The signals applied are themselves modulated, in order to modulate (S20, S20a, S20b) the frequency of the tunable coupler 20. This, in turn, makes it possible to drive (S30, S30a, S30b) the desired first-order transitions.

Timers may be associated to the applied signals, at the level of the controller. At the end of a cycle, the signals applied are interrupted (S50) and a new cycle may then start (S10), as determined by the controller 32.

As mentioned earlier, red sideband transitions are preferably (but not necessarily) involved, whereby such transitions correspond to energy differences which are, each, smaller than the energy difference corresponding to the frequency of the tunable coupler. Each of the first and second transitions involved may be a first-order, red sideband transition, as assumed in FIGS. 6 and 8. First-order transitions allow improved operation times and process efficiency, compared to second-order or higher-order transitions. This can be achieved by leveraging specific excited states as described now. Namely, each frequency at which the tunable coupler 20 is modulated corresponds to a difference of energy between a pair of excited states of the quantum processing device. Yet, each pair of excited states may, in embodiments of the invention, involve a same excited state of the system constituted by the circuits 11-14 and the coupler 20. This "same" excited state, referred to as a reference excited state, arises from an excited state |1> of the tunable coupler 20. This reference excited state is noted |gg . . . , 1>. In other words, the reference excited state is representable as a tensor product of the excited state |1> of the tunable coupler 20 (e.g., the first excited state thereof) and a ground state |g> of each of the quantum circuits 11-14.

Each frequency may for instance correspond to a difference of energy between this reference excited state |gg . . . , 1> and another excited state, noted |ab . . . , 0>, arising from an excited state |e> of one (only) of the quantum circuits 11-14. In other words, the state |ab . . . , 0> is, this time, representable as a tensor product of the ground state |0> of the tunable coupler 20 and a state |ab . . . > of the quantum circuits 11, 12, . . . and so forth. That is, |ab . . . , 0>=|ab . . . >⊗|0>. Now, |ab . . . , 0> involves the excited state |e> of exactly one of the quantum circuits 11, 12, . . . and so forth, and the ground state |g> of each of the remaining quantum circuits 11, 12, . . . and so forth. In other words, only one of the states |a>, |b>, . . . and so forth corresponds to an excited state |e> in the product |a>⊗|b>⊗ . . . and so forth.

Figure 6:
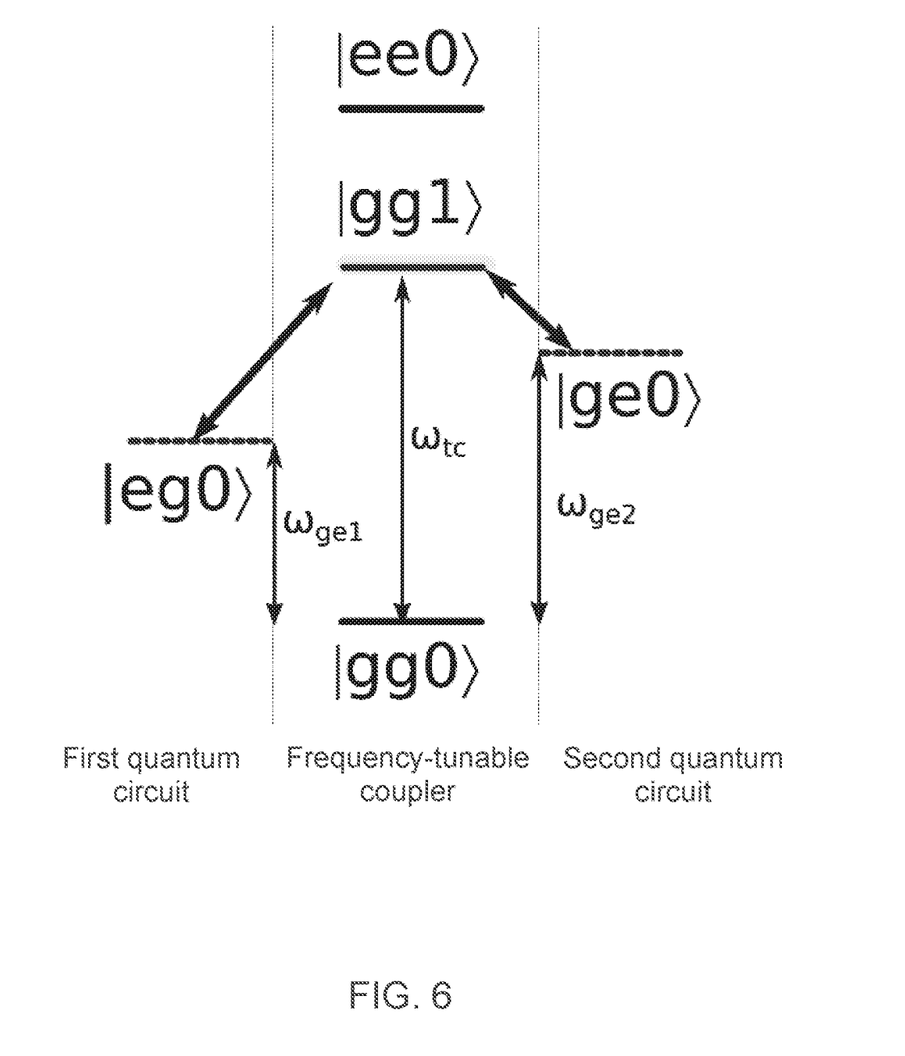
FIG. 6 is a graphic depicting quantum states associated with two quantum circuits (e.g., computational qubits) coupled to a tunable coupler, as in FIG. 1 or 2, as well as first-order energy transitions, according to embodiments of the present invention.

Consider for example a simple architecture, based on two quantum circuits 11, 12 (computational qubits Q1, Q2), as in FIGS. 1 and 2. A corresponding level diagram is shown in FIG. 6. Each modulation frequency $\omega_{ge1}$ and $\omega_{ge2}$ corresponds to a respective energy difference, which nevertheless involves a reference excited state |gg, 1>. The first modulation frequency $\omega_{ge1}$ corresponds to the difference between the energy of |gg, 1> and the energy of the excited state |eg, 0>, the latter involving only one excited state |e>, i.e., the excited state of the first quantum circuit (circuit 11, or Q1). Consistently, the second modulation frequency $\omega_{ge2}$ corresponds to the difference between the energy of |gg, 1> and the energy of the other excited state |ge, 0>, which solely involves the excited state |e> of the other quantum circuit (Q2). The frequency of the tunable coupler, $\omega_{tc}$, is determined by the difference between the energy of the excited state |1> and the ground state |0> of the coupler.

More generally, when more than two circuits 11, 12, . . . and so forth are involved, the reference excited state involved is |gg . . . , 1>, while the other excited states, i.e., |ge . . . , 0>, |eg . . . , 0>, . . . and so forth, arise from first excited states of the basis quantum circuits 11, 12, . . . and so forth yet involving one (and only one) excitation at a time. In other words, each element of the set {a, b, . . . } of sub-states of the quantum circuits corresponds to an excited state |e> or a ground state |g> of a respective quantum circuit. Because exactly one excited state of a given one of the quantum circuits is involved, the other quantum circuits are in their ground state.

Based on excited states as described above and a suitable coupling of the quantum circuits, first-order, red sideband energy transitions can be achieved, which can easily be triggered by applying coherent microwave tones. Coherent microwave tones can for instance be applied thanks to a controller realized as a (coaxial, microwave) cable that creates a current and subsequently a magnetic field penetrating a squid loop, so as to modulate the frequency of the coupler, as latter discussed in reference to FIGS. 1-5.

Figure 7:
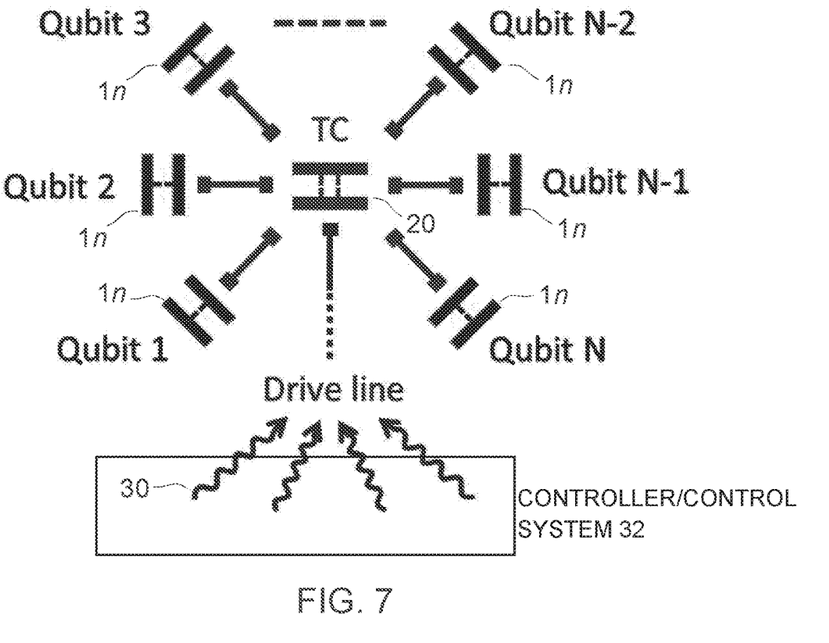
FIG. 7 schematically illustrates the modulation of the tunable coupler frequency, to which six transmon qubits are coupled in this example, and where harmonic microwave tones are simultaneously applied to the tunable coupler element via a single drive line, according to embodiments of the present invention.
Figure 8:
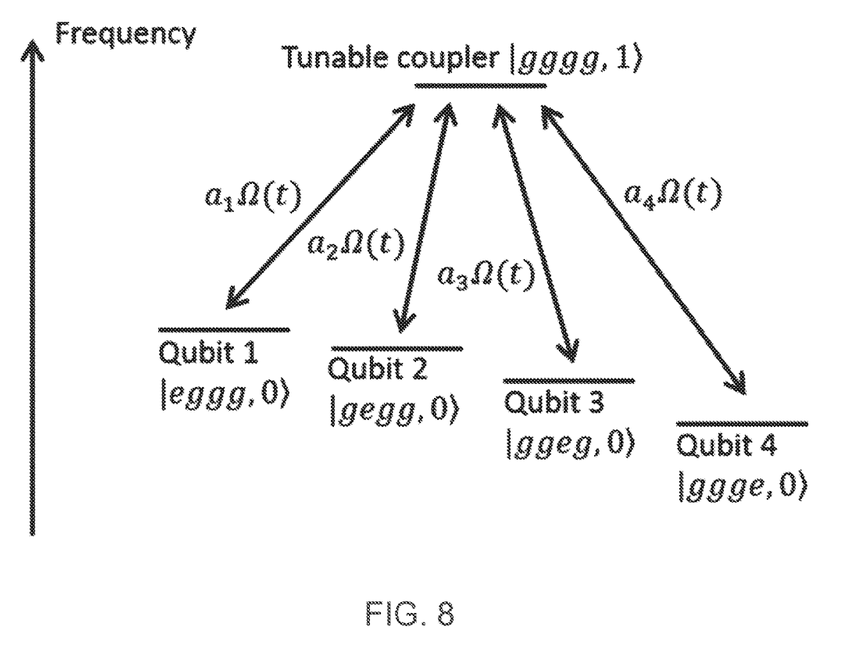
FIG. 8 is a graphic depicting quantum states associated to four fixed frequency qubits coupled to a tunable coupler, as in the configuration of FIG. 3, where transitions are driven simultaneously so as to produce an entangled state, according to embodiments of the present invention.

As defined earlier, that the first and second frequencies "correspond", each, to a difference of energy means that such frequencies can be equal to such energy differences or, in variants, close to such differences of energy (and close enough, so as for the desired transitions to take place). That is, the driving of a possible transition can be resonant (i.e., the energy difference matches the drive frequency) or off-resonant (i.e., the energy is slightly off the drive frequency). Relying on slightly off-resonant frequencies, as in so called "stimulated Raman adiabatic passage" (STIRAP) schemes, results in the population of the reference excited state being avoided, because off-resonant frequencies are utilized for driving the transitions Beyond systems including a single pair of fixed frequency quantum circuits, the present methods can advantageously be applied to a quantum processing device 3 that comprises three, four, or more fixed frequency quantum circuits, as illustrated in FIG. 7 or 8. Again, each of the fixed frequency quantum circuits 11, 12, 13, . . . and so forth need to be coupled to a frequency-tunable coupler 20. Consistent with methods as described above, the frequency $\omega_{tc}$ of the tunable coupler can be concomitantly modulated (S20), on the one hand, at a first frequency (so as to drive (S30) a first transition and transfer an excitation from one of the circuits to the tunable coupler) and, on the other hand, at two or more second frequencies, so as to concomitantly drive (S30) two or more second transitions, respectively. This way, excitations can be transferred (S40) from the tunable coupler 20 to two or more other ones of the quantum circuits. Again, each of said second transitions is a first-order energy transition and, preferably a red sideband transition as discussed above.

As illustrated in FIG. 7, this approach can notably be used to entangle N fixed frequency superconducting transmon qubits with a single short operation. The common tunable coupling element may for instance be embodied as a frequency-tunable, superconducting qubit, i.e., a SQUID loop. As further depicted in FIG. 7, an entangled state between the computational qubits can be created in a single step by simultaneously applying coherent microwave tones (wave arrows) to the tunable coupler via a single drive line.

For example, and as illustrated in FIG. 8, a red sideband transition can be induced by modulating the frequency of the tunable coupler with a coherent microwave tone set at the difference frequency between the excited state |gggg,1> of the tunable coupler and the excited state |eggg,0> of qubit 1. This transition transfers an excitation from the qubit to the tunable coupler with, for example, a (time-dependent) rate S21. By simultaneously modulating the tunable coupler with additional coherent microwave tones set at the difference frequencies between |gggg,1> and the first excited states arising from the remaining qubits, this excitation can then be shared between all qubits. The resulting quantum state is a multipartite entangled state, where entanglement is shared between multiple qubits.

In the example of FIG. 8, the tunable coupling element is assumed to capacitively couple to all computational, transmon qubits. As a consequence, the gate rates $\Omega i$ of the red sideband transitions will be on the order of the (capacitive) couplings between the transmon qubits and the tunable coupler. This, given that first-order transitions are relied on, makes it possible for the gate rates to be as high as 100 MHz.

By driving all red sideband transitions simultaneously (for qubit 1, qubit 2, qubit 3, and qubit 4 in FIG. 8), a multipartite entangled state can therefore be realized within 10 ns, i.e., as fast as a single qubit operation. In light of the high coherence of the fixed frequency transmon qubits, such entangled multi-qubit states are also generated with very high fidelities (approaching unity). As a result, the present approach can be used to mitigate problems arising from sequential state preparation (as discussed in the background section), according to embodiments of the invention. This approach can thus allow longer and more complex algorithms to be implemented within the coherence time of the fixed frequency qubits.

Interestingly, the approach proposed here is applicable for arbitrary frequency differences between the tunable coupler and the transmon qubits. This is particularly appealing, in as much as larger frequency differences (>1 GHz) between the tunable coupler and transmon qubits would be essential or used to address the specific problem of frequency crowding, which is particularly prominent in the frequency range below 1 GHz.

As discussed earlier, gate operations as contemplated herein may further require suitably setting amplitudes and phases of the signals applied to the tunable coupler 20, in addition to modulating frequencies, to trigger the desired first-order transitions. With carefully selected amplitudes and phases, one may simultaneously drive at the difference frequencies between the remaining N−1 qubits and the coupler, so as to populate additional excited states arising from the remaining qubits. This way, an initial excitation can be shared among all qubits, which can be exploited to achieve (S20-S40) a multipartite entangled state.

Practically, operations described herein (e.g., steps S20, S20a, S20b, in FIGS. 9, 10) can be carried out so as to implement quantum gates. Various types of quantum gates can be envisioned, in the context of embodiments of the invention. At a minimum, the present approach can be exploited to implement a quantum gate reversibly operating on at least one of the quantum circuits 11-14, 1n. In other words, this gate can be described by a unitary matrix. More generally yet, quantum gates can be implemented, which operate on states of any subset, or even all of the quantum circuits 11-14, 1n. However, because the tunable coupler is, here, not meant to be operated as a computational qubit, such a quantum gate will not operate, effectively, on the tunable coupler 20.

That a gate "operates on" states of one or more of the quantum circuits but not on the coupler means that the frequency of the tunable coupler 20 is modulated, so as to transfer excitations from one circuit to the other(s). The state of the tunable coupler 20 may possibly be altered in the process. However, after the gate operation, the tunable coupler is back to its initial state (identity operation). Thus, the gate does, effectively, not operate on the tunable coupler.

The frequency of the tunable coupler 20 may notably be modulated (S20, S20a, S20b) so as to implement (S20-S50) a universal, finite set of gates operating on states of two or more of the quantum circuits 11-14, 1n, e.g., in combination with single qubit gates. For example, this universal set of gates enables a set of operations to be performed with the quantum processing device 1, 3, 4, where such operations can be reduced (or, possibly, approximated) by a sequence of gates from this finite set. In other words, operations enabled by the device 1, 3, 4 can be translated into a finite sequence of gates from this universal set.

Implementing such a universal set of gates may further require suitably setting amplitudes and phases of the signals applied to the coupling elements 20, in addition to merely modulate its frequency, as discussed earlier. However, none of these gates will effectively be based on states of the tunable coupler 20. In particular, appropriate frequencies, amplitudes and phase pulses of the drives can be chosen, so as to achieve an iSWAP gate, a c-Phase gate, a Fredkin gate (also known as CSWAP gate, or a square root of SWAP gate (commonly denoted by $\sqrt{SWAP}$). Such gates are known per se. Interestingly here, such gates can be operated on states of one or more of the fixed frequency quantum circuits, to exploit their longer coherence time. Any combination of the examples of gates cited above can in fact be contemplated, e.g., to form a universal, finite set of gates.

Another interesting feature of the present approach is that the drives at the first and second frequencies may be switched on (when modulating the frequency of the tunable coupler) at paces chosen so as to generate an adiabatic holonomic gate transformation. In such a transformation, populating the excited state of the tunable coupler is strongly suppressed during and after applying the pulses, assuming the pulses are slow and not applied simultaneously. A non-adiabatic holonomic gate, in contrast, uses fast pulses simultaneously. In this case, the excited state is populated during, but not after the pulses. Also, the adiabatic transfer implies a modulation frequency that is slightly detuned from the transition frequencies, whereas in embodiments of the invention as otherwise described herein, the modulation frequencies should in general be at or close to the transition frequencies.

Referring to FIGS. 1-5 and 7, another aspect of embodiments of the invention is now discussed, which relates to quantum processing devices 1, 3, 4. Main aspects of such devices have already been discussed in respect of the present methods. Therefore, such devices are only briefly described in the following.

At a minimal, such devices 1, 3, 4 comprise two fixed frequency quantum circuits 11-14, 1n, in addition to a tunable coupler 20, to which the quantum circuits are coupled. Again, the quantum circuits are meant to be used as computational qubits, contrary to the coupling element 20. The present devices, however, may comprise more than two quantum circuits and more than one coupler 20, as in FIG. 5. In addition, such a quantum processing device 1, 3, 4 includes a controller 30 (of control system 32). The controller 30 is configured in the processing device 1, 3, 4 to modulate a frequency of signals applied to the tunable coupler 20, so as to drive first-order energy transitions in the quantum processing device 1, 3, 4. As explained earlier, this makes it possible for an excitation of one of the quantum circuits to be transferred (at least partly) to one or more of the remaining circuits, via the tunable coupler 20, in operation.

The controller/control system 32 will typically include (or be implemented as) a control line 30 (i.e., a physical wire), to apply the signals. The controller allows multi-frequency signals to be applied and, if necessary, to suitably set amplitudes and phases of the applied signals. The control system 32 is configured to apply the signals discussed herein via one or more control lines 30 as understood by one skilled in the art.

In particular, the controller having control lines 30 may be configured to modulate the frequency of the coupler 20 at a first frequency (to drive a first transition and thereby transfer an excitation from one quantum circuit to the coupler 20) and at one or more second frequencies, each distinct from the first frequency. This way, one or more second transitions can be driven, to further transfer this excitation from the coupler 20 to one or more of the remaining quantum circuits, consistently with principles described earlier. Again, each of the first transition and second transitions is a first-order energy transition, e.g., a red sideband transition.

The controller having control lines 30 may notably be configured to impose a certain time gap between the various modulations applied. Preferably (but not a necessity), though, the controller may concomitantly modulate signals applied to the tunable coupler 20, so as to concomitantly drive first and second transitions, as explained earlier.

Figure 5:
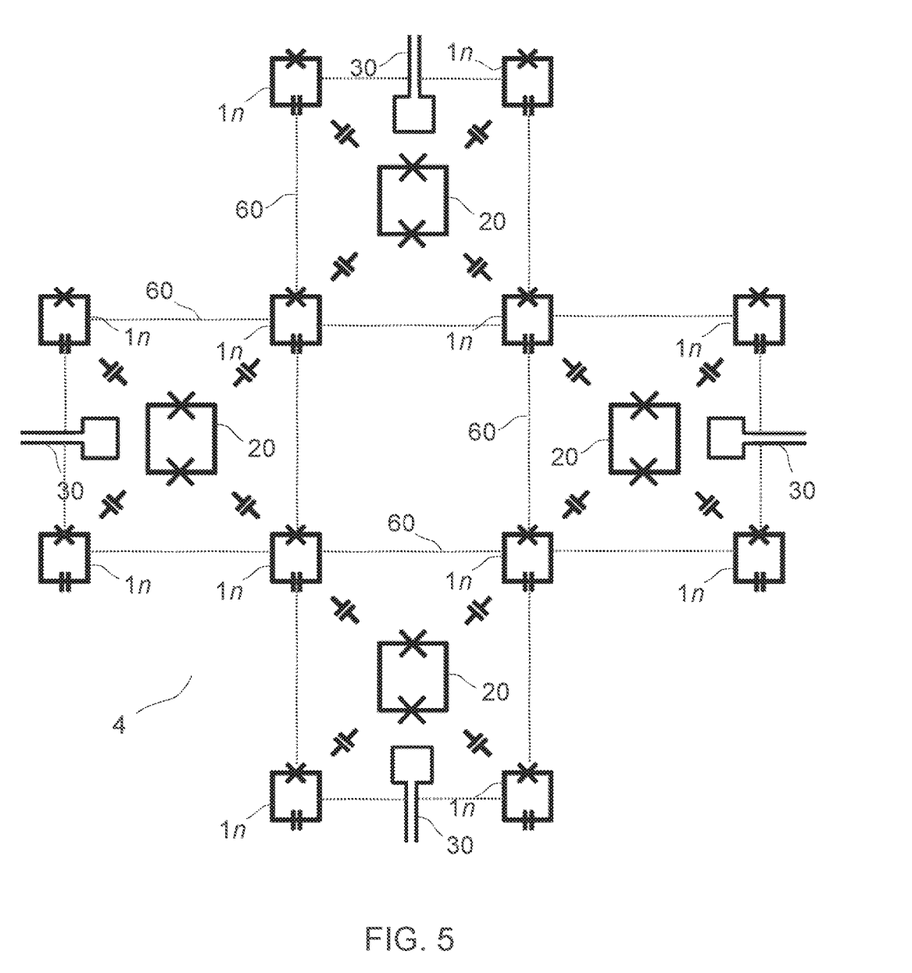
FIG. 5 shows a circuit diagram of an example of a multi-qubit coupling architecture, involving one or more frequency-tunable couplers, according to embodiments of the present invention.

As illustrated in FIGS. 3, 5 and 7, embodiments of the present quantum processing devices 3, 4 may involve more than two, e.g., three, four, six or more fixed frequency quantum circuits 1n, where each circuit is coupled to the tunable coupler 20. The controller having control lines 30 is further adapted to concomitantly modulate the frequency of the coupler 20 at a first frequency (to drive a first transition) and at two or more second frequencies, so as to concomitantly drive two or more second transitions. Thus, excitations can be transferred from the tunable coupler 20 to at least two of the remaining quantum circuits 1n, in operation.

Preferably (but not a necessity), the present quantum circuits 11-14, 1n are embodied as superconducting quantum circuits, forming the basis computational elements. In particular, the present circuits can be fixed frequency, transmon-type quantum circuits, realized as single-Josephson junction superconducting qubits. This way, the processing devices 1, 3, 4 take advantage of long coherence times of the fixed frequency transmons. Note that the coupler 20 too may be realized by a transmon, although the coupler 20 will not form part of the basis computational elements 11-40, 1n.

In all cases, the tunable coupler 20 may be capacitively coupled to each of the quantum circuits 11-14, 1n. For example, and as illustrated in FIG. 1, a processing device 1 may involve two fixed frequency, single-Josephson junction superconducting qubits 11, 12 with long coherence times (e.g., transmon-type devices) as the basis computational elements and a tunable coupler 20. In this example, the tunable coupler 20 is laid out as a non-harmonic oscillator circuit, such as a qubit of the transmon type. Yet, the coupler is given an extra degree freedom, by way of an additional Josephson junction (⸺✕⸺) having an X symbol, which forms a superconducting quantum interference device (SQUID) loop. In turn, the SQUID loop can be used to tune the coupler's frequency. In the example of FIG. 1, the modulation of the tunable coupler frequency is realized by altering the magnetic flux $\phi(t)$ penetrating the SQUID loop formed by the two Josephson junctions via a current $I(t)$ passed through an inductively coupled flux bias line 30. The modulation of the flux induces a modulation of the coupling strength $J(t)=J\cos(\Delta t)$. Each qubit 11, 12 is capacitively coupled (⸺‖⸺) (having a parallel lines symbol) to a readout resonator 41, 42 (i.e., also denoted by R1 and R2 in FIG. 1) and a charge bias line (not shown) for single qubit gate operations.

The coupling is performed by modulating the frequency of the tunable coupler 20 near or at the frequency corresponding to first-order energy transitions, e.g., red sideband transition as illustrated in FIG. 6. This, in turn, allows a two-qubit quantum gate implementation.

The coupler can be regarded as formed by one or more electrodes, as well as the SQUID loop (the SQUID loop containing the two Josephson junctions). The tunable coupler 20 may for instance couple to the two (or more) transmons 11, 12, via separate electrodes (the latter separated by the SQUID loop) or via a single electrode, with the SQUID loop coupling to the ground. FIG. 2 shows example geometry for two transmon-type qubits 11, 12 coupled via a third transmon 20 acting as a frequency-tunable coupling element. External magnetic flux applied via the inductively-coupled bias line 30 threads the SQUID loop at the center of the tunable coupler 20 and modifies its frequency by modifying the effective Josephson inductance. The symmetric placement of the flux-bias line 30 inhibits the decay of the coupling transmon 20 by minimizing the capacitive coupling to the flux-line 30.

The tunable coupler 20 can be designed to couple capacitively to more than two qubits, as shown in FIG. 3. The example architecture of FIG. 3 is essentially similar to that of FIG. 1, except that an additional pair of qubits 13, 14 (i.e., Q3, Q4) now mirrors the first pair 11, 12 (i.e., Q1, Q2). Each additional qubit 13, 14 is again capacitively coupled to a readout resonator 43, 44 (i.e., R3 and R4 in FIG. 3) and a charge bias line (not shown). In this example too, the modulation of the tunable coupler frequency can be achieved by altering the magnetic flux $\phi(t)$ penetrating the SQUID loop via a current $I(t)$ passed through the inductively coupled flux bias line 30. This, in turn, induces a modulation of the coupling strength, which is exploited to trigger first-order energy transitions, according to the present methods. Similarly, the example geometry of FIG. 4 is similar to that of FIG. 2, except for the additional pair of qubits 13, 14. In addition, each qubit is now rotated with respect to a previous qubit, and the geometry of the coupler is adapted to the four-qubit configuration.

Another aspect of embodiments of the invention is now described in reference to FIG. 5, which relates to a quantum processing chip 4. The quantum processing chip 4 comprises a plurality of cells 60, each comprising two or more fixed frequency quantum circuits 1n, as well as a tunable coupler 20, to which the two or more quantum circuits 1n are coupled. In the example architecture of FIG. 5, the cells form a 2D lattice. Yet, the central square delimited by the four inner qubits does not correspond to a cell in this example, as they are not coupled to a same tunable coupler. Each of the four inner qubits bridges one cell to a contiguous cell, such that the cells effectively comprise, each, three qubits on average. Yet, the depicted architecture allows four qubits to be operated per cell. Each cell 60 is otherwise similar to the four qubit arrangement depicted in FIG. 3. In the architecture of FIG. 5, all nearest neighbor qubits can be coupled (except for qubit pairs on the central square). This architecture, however, can be modified to include a coupler at the center to increase the connectivity between the qubits.

In FIG. 5, a controller system (is, includes, and/or is connected to a control line 30 in a loop) is used to modulate a frequency of signals applied to each tunable coupler 20, e.g., via respective control lines 30, so as to drive first-order energy transitions in selected cells. In other words, cells can be independently operated, via a respective control line 30. However, the operation of the cells follows a logic implemented by the controller system (such as the control system 32 in FIG. 7), e.g., so as to enable a sequence of gates, which in turn allows more complex operations to be performed by the quantum processing chip 4.

For each operated cell 60, an excitation of one of the quantum circuits 1n can be transferred to one or more of the remaining circuits 1n of the cell, via a respective tunable coupler 20, in operation.

While the embodiments of the present invention have been described with reference to a limited number of variants and the accompanying drawings, it will be understood by those skilled in the art that various changes may be made and equivalents may be substituted without departing from the scope of embodiments of the present invention. In particular, a feature (device-like or method-like) recited in a given embodiment of the invention, variant or shown in a drawing may be combined with or replace another feature in another embodiment of the invention, variant or drawing, without departing from the scope of embodiments of the present invention. Various combinations of the features described in respect of any of the above embodiments of the invention or variants may accordingly be contemplated, that remain within the scope of the appended claims. In addition, many minor modifications may be made to adapt a particular situation or material to the teachings of embodiments of the present invention without departing from its scope. Therefore, it is intended that description not be limited to the particular embodiments of the invention disclosed herein, but that the will include all embodiments of the invention falling within the scope of the appended claims. In addition, many other variants than explicitly touched above can be contemplated.

What is claimed is:

1. A method of operating a quantum processing device, the method comprising:
    modulating a frequency of a tunable coupler so as to drive two first-order energy transitions, wherein the quantum processing device comprises at least two fixed frequency quantum circuits coupled to the tunable coupler, wherein the frequency of the tunable coupler is operable to be modulated so as to drive at least two selectively addressable energy transitions in the quantum processing device; and
    in response to modulating the frequency of the tunable coupler so as to drive the two first-order energy transitions, causing a first excitation of one of the at least two fixed frequency quantum circuits such that the first excitation is at least partly transferred to at least another one of the at least two fixed frequency quantum circuits, via the tunable coupler;
    wherein the frequency of the tunable coupler is modulated at:
    a first frequency, so as to alive a first transition and thereby transfer, at least partly, the first excitation of said one of the at least two fixed frequency quantum circuits to the tunable coupler; and
    at least one second frequency distinct from the first frequency, so as to drive at least one second transition, respectively, and thereby further transfer, at least partly, the first excitation from the tunable coupler to said at least one another one of the at least two fixed frequency quantum circuits, wherein each of the first transition and the at least one second transition is a first-order energy transition.

2. The method according to claim 1, wherein the frequency of the tunable coupler is first modulated at said first frequency to drive the first transition and is subsequently modulated at said at least one second frequency to drive the at least one second transition after the first transition.

3. The method according to claim 1, wherein the frequency of the tunable coupler is concomitantly modulated at said first frequency and said at least one second frequency, so as to concomitantly drive the first transition and the at least one second transition.

4. The method according to claim 3, wherein modulating the frequency of the tunable coupler further comprises switching on drives at said first frequency and said least one second frequency at paces so as to generate an adiabatic holonomic gate transformation.

5. The method according to claim 1, wherein, for modulating the frequency of the tunable coupler, each of the first frequency and the at least one second frequency corresponds to a difference of energy between a pair of excited states of the quantum processing device, respectively, whereby each pair of excited states involves a reference excited state |gg . . . , 1>, which is representable as a tensor product involving an excited state |1> of the tunable coupler and a ground state |g> of each of the least two fixed frequency quantum circuits.

6. The method according to claim 5, wherein each of the first frequency and the at least one second frequency corresponds to a difference of energy between said reference excited state |gg . . . , 1> and an excited state |ab . . . , 0>, the excited state |ab . . . , 0> representable as a tensor product involving a ground state |0> of the tunable coupler and a state |ab . . . > of the at least two fixed frequency quantum circuits, where the state |ab . . . > is representable as a tensor product involving the excited state |e> of only one of the at least two fixed frequency quantum circuits and a ground state |g> of each of the remaining at least two fixed frequency quantum circuits.

7. The method according to claim 1, wherein the first-order energy transition is driven by applying harmonic microwave signals to the tunable coupler, the harmonic microwave signals modulated so as to modulate the frequency of the tunable coupler, in order to drive said first transition and said at least one second transition.

8. The method according to claim 1, wherein the quantum processing device further comprises at least three fixed frequency quantum circuits, each coupled to said tunable coupler; and
    wherein the frequency of the tunable coupler is concomitantly modulated at said first frequency, so as to drive said first transition, and at two or more second frequencies, so as to concomitantly drive two or more second transitions, respectively, whereby excitations are transferred, at least partly, from the tunable coupler to two or more other ones of the at least three fixed frequency quantum circuits, each of said two or more second transitions being a first-order energy transition.

9. The method according to claim 8, further comprising setting amplitudes and phases of signals applied to the tunable coupler, so as to achieve a multipartite entangled state of the at least three fixed frequency quantum circuits.

10. The method according to claim 1, wherein the frequency of the tunable coupler is modulated so as to implement a quantum gate operating on at least one of said at least two fixed frequency quantum circuits; and wherein the quantum gate does not operate, effectively, on the tunable coupler.

11. The method according to claim 1, wherein the frequency of the tunable coupler is modulated so as to implement a universal set of gates based on states of the at least two fixed frequency quantum circuits; and wherein the universal set of gates are not based on states of the tunable coupler.

12. The method according to claim 11, further comprising setting amplitudes and phases of signals applied to the tunable coupler, so as to achieve one or more selected from the group consisting of: an iSWAP gate, a c-Phase gate, a Fredkin gate, and a square root of SWAP gate.

13. A quantum processing device comprising:
at least two fixed frequency quantum circuits;
a tunable coupler, to which the at least two fixed frequency quantum circuits are coupled; and
a controller in the quantum processing device, the controller configured to modulate a frequency of signals applied to the tunable coupler, so as to drive at least two first-order energy transitions in the quantum processing device, such that a first excitation of one of the at least two fixed frequency quantum circuits is operable to be transferred, at least partly, to at least another one of the at least two fixed frequency quantum circuits, via the tunable coupler, in operation;
wherein the controller is further configured to modulate the frequency of signals applied to the tunable coupler at:
a first frequency, so as to drive a first transition and thereby transfer, at least partly, the first excitation of said one of the at least two fixed frequency quantum circuits to the tunable coupler, in operation; and
at least one second frequency distinct from the first frequency, so as to drive at least one second transition, respectively, and thereby further transfer, at least partly, the first excitation from the tunable coupler to said at least another one of the at least two fixed frequency quantum circuits, in operation, where each of the first transition and the at least one second transition is a first-order energy transition.

14. The quantum processing device according to claim 13, wherein the controller is further configured to first modulate the frequency of signals applied to the tunable coupler at said first frequency, so as to drive the first transition, and to subsequently modulate said first frequency at said at least one second frequency, to drive the at least one second transition after the first transition, in operation.

15. The quantum processing device according to claim 13, wherein the controller is further configured to concomitantly modulate signals applied to the tunable coupler at said first frequency and said at least one second frequency, so as to concomitantly drive the first transition and the at least one second transition, in operation.

16. The quantum processing device according to claim 15, wherein the quantum processing device comprises at least three fixed frequency quantum circuits, each coupled to said tunable coupler; and wherein the controller is further configured to concomitantly modulate the frequency of signals applied to the tunable coupler at said first frequency, so as to drive said first transition, and at two or more second frequencies, so as to concomitantly drive two or more second transitions, whereby excitations are transferred, at least partly, from the tunable coupler to at least two other ones of the at least three fixed frequency quantum circuits, in operation, each of said two or more second transitions being a first-order energy transition.

17. The quantum processing device according to claim 13, wherein each of said at least two fixed frequency quantum circuits is a superconducting quantum circuit.

18. The quantum processing device according to claim 13, wherein each of said at least two fixed frequency quantum circuits is a fixed frequency, transmon-type quantum circuit.

19. The quantum processing device according to claim 13, wherein the tunable coupler is capacitively coupled to each of the at least two fixed frequency quantum circuits.

20. A quantum processing chip, comprising
a plurality of cells, each comprising:
at least two fixed frequency quantum circuits; and
a tunable coupler, to which the at least two fixed frequency quantum circuits are coupled; and
a controller system in the quantum processing chip, the controller system configured to modulate a frequency of signals applied to the tunable coupler of each of the plurality of cells, so as to drive at least two first-order energy transitions in selected ones of the plurality of cells, such that, for each of said selected ones of the plurality of cells: a first excitation of one of the at least two fixed frequency quantum circuits is transferred, at least partly, to at least another one of the at least two fixed frequency quantum circuits, via a respective tunable coupler, in operation;
wherein the controller system is further configured to modulate the frequency of signals applied to the tunable coupler at:
a first frequency, so as to drive a first transition and thereby transfer, at least partly, the first excitation of said one of the at least two fixed frequency quantum circuits to the tunable coulter, in operation; and
at least one second frequency distinct from the first frequency, so as drive at least one second transition, respectively, and thereby further transfer, at least partly, the first excitation from the tunable coupler to said at least another one of the at least two fixed frequency quantum circuits, in operation, where each of the first transition and the at least one second transition is a first-order energy transition.

* * * * *

UNITED STATES PATENT AND TRADEMARK OFFICE
CERTIFICATE OF CORRECTION

PATENT NO. : 10,354,198 B1  
APPLICATION NO. : 15/927502  
DATED : July 16, 2019  
INVENTOR(S) : Stefan Filipp et al.

Page 1 of 1

It is certified that error appears in the above-identified patent and that said Letters Patent is hereby corrected as shown below:

On the Title Page

Item [72], should read:  
... Stefan Filipp, Zurich (CH)  
Nikolaj Moll, Thalwil (CH)  
Daniel J. Egger, Thalwil (CH)  
Marc Ganzhorn, Muhen (CH)  
Andreas Fuhrer Janett, Zurich (CH)  
Gian R. Von Salis, Aeugst a.A. (CH) ...

Signed and Sealed this  
Twenty-ninth Day of October, 2019

Andrei Iancu  
*Director of the United States Patent and Trademark Office*